United States Patent
Jahanshir et al.

(10) Patent No.: US 6,469,482 B1
(45) Date of Patent: Oct. 22, 2002

(54) INDUCTIVE CHARGE PUMP CIRCUIT FOR PROVIDING VOLTAGES USEFUL FOR FLASH MEMORY AND OTHER APPLICATIONS

(75) Inventors: Javanifard Jahanshir, Carmichael, CA (US); Priya Walimbe, Folsom, CA (US); Richard B. Foehringer, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 118 days.

(21) Appl. No.: 09/607,483

(22) Filed: Jun. 30, 2000

(51) Int. Cl.[7] ................................. G05F 1/10
(52) U.S. Cl. ........................ 323/282; 323/222
(58) Field of Search ................ 323/282, 285, 323/222, 313

(56) References Cited

U.S. PATENT DOCUMENTS

| | | | | |
|---|---|---|---|---|
| 4,437,146 A | | 3/1984 | Carpenter | 363/21 |
| 4,536,700 A | * | 8/1985 | Bello et al. | 323/222 |
| 4,683,529 A | | 7/1987 | Bucher, II | 323/282 |
| 5,172,342 A | | 12/1992 | Gochi | 365/226 |
| 5,402,060 A | | 3/1995 | Erisman | 323/268 |
| 5,469,399 A | | 11/1995 | Sato et al. | 365/226 |
| 5,894,243 A | | 4/1999 | Hwang | 323/282 |
| 5,905,369 A | * | 5/1999 | Ishii et al. | 323/222 |
| 5,910,725 A | * | 6/1999 | Gist | 323/313 |
| 5,929,620 A | | 7/1999 | Dobkin et al. | 323/285 |
| 5,949,229 A | * | 9/1999 | Choi et al. | 323/222 |
| 6,037,755 A | * | 3/2000 | Mao et al. | 323/222 |
| 6,175,218 B1 | * | 1/2001 | Choi et al. | 323/222 |
| 6,178,104 B1 | * | 1/2001 | Choi | 323/222 |
| 6,275,014 B1 | * | 8/2001 | Sudo | 323/222 |
| 6,323,626 B1 | * | 11/2001 | Raiser | 323/222 |

FOREIGN PATENT DOCUMENTS

EP      0929143 A2      7/1999

OTHER PUBLICATIONS

Circuit to Linearize the Control Loop of a Switching Voltage Regulator, R.E. Calvo & G.C. Johari, IBM Technical Disclosure Bulletin, vol. 22, No. 6, Nov. 1979.

* cited by examiner

Primary Examiner—Trong Phan
(74) Attorney, Agent, or Firm—Blakely- Sokoloff- Taylor & Zafman LLP

(57) ABSTRACT

A DC voltage boost circuit capable of improved efficiency. The DC voltage boost circuit includes an inductive element, a switching device, an output capacitive element, and a regulation circuit. The switching device periodically causes current to flow through the inductive element in response to a control signal. Each time the switching device causes current to flow through the inductive element, the inductive element stores the energy. When the switching device stops the current from flowing through the inductive element, the stored energy is then transferred to the output capacitive element. The capacitive element accumulates the packets of energy stored in the inductive element in the form of charges to form the output voltage of the booster. A regulation circuit is provided to sample the booster output voltage and to generate the control signal for the switching device such that the output voltage is regulated. The control signal can be frequency modulated or pulse width modulated. An integrated circuit is also disclosed comprising a package, a die incorporating the switching device and regulation circuit, wherein the inductive and capacitive elements are situated within the package, but outside of the die.

52 Claims, 12 Drawing Sheets

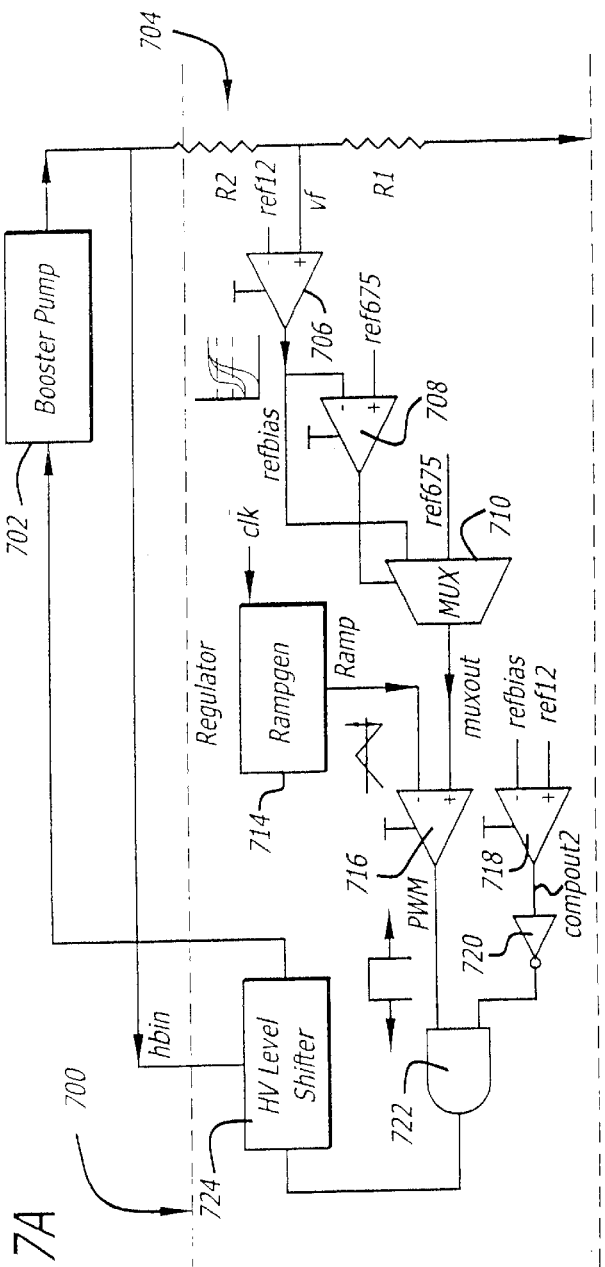
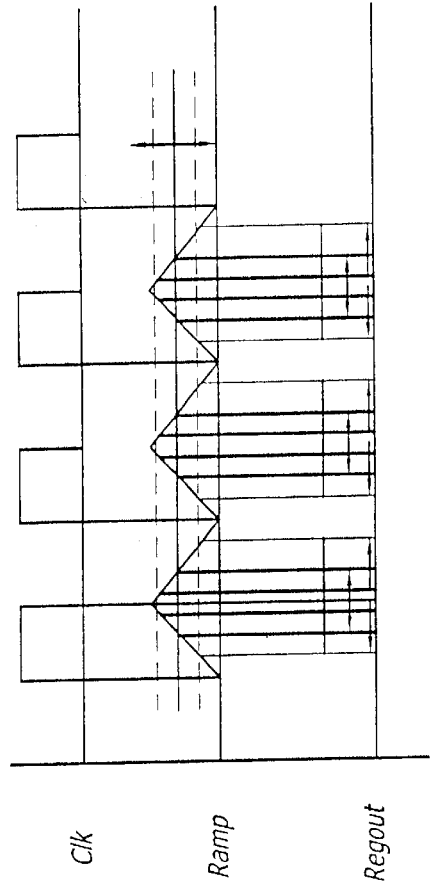
FIG. 7A
FIG. 7B

| Count | | | |
|---|---|---|---|
| bit0 | bit1 | bit2 | pwm_clk |
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

INDUCTIVE CHARGE PUMP CIRCUIT FOR PROVIDING VOLTAGES USEFUL FOR FLASH MEMORY AND OTHER APPLICATIONS

CROSS REFERENCE TO A RELATED APPLICATION

This application is related to Patent Application entitled "Regulator Design for Inductive Booster Pump Using Pulse Width Modulation Technique," filed on the same date as this application.

FIELD OF THE INVENTION

This invention relates generally to direct current (DC) voltage boosting circuits, and in particular, to a DC voltage boosting circuit that includes an inductive charge pump circuit for producing one or more regulated DC voltages useful for flash memory and other applications.

BACKGROUND OF THE INVENTION

Many applications require circuits that can boost up an input power supply DC voltage to a higher DC voltage used for specialized operations. The reason for the voltage boost up is that often only standardized power supply voltages are available for supplying power to electronic circuits. However, there may situations where a circuit needs a higher voltage than one available from the associated power supply. One example of such a circuit is an electrical erasable programmable read only memory (EEPROM), typically termed in the art as "flash memory."

A flash memory generally comprises an array of memory cells each typically storing a bit of digital information. Often, a memory cell is merely a field effect transistor (FET) that includes a floating gate which holds a charge that corresponds to a bit of digital information (termed herein as a "bit charge"). More specifically, a memory cell FET comprises a drain, gate, and a source, wherein the gate includes a control gate for enabling reading, writing, and erasing operations on the cell, and a floating gate for storing the bit charge of digital information. In addition to these gates, some memory cells include an erase gate used for removing the bit charge from the floating gate, thereby erasing the memory cell.

The writing (i.e. programming) of a bit charge of digital information typically involves electrons that tunnel or inject from the FET channel through the thin gate oxide to the floating gate. Generally, the tunneling effect or hot electron injection requires relatively high energy to move the electrons across the gate oxide layer. Similarly, the removing of electrons from the floating gate during an erase procedure requires relatively high energy to move the electrons across the gate oxide or an oxide situated between the erase and floating gates. The source for the high energy for both the writing and erasing operations is typically a relatively high voltage source, which is higher than the power supply voltages used for memory control operations. For example, the voltage required for writing and reading operations may be on the order of six (6) volts, whereas the voltage for the memory control normal operations may be on the order of 1.5 volts.

In a typical flash memory circuit, the majority of the circuit operations require a voltage on the order of 1.5 volts, for example. Thus, the design of the power supply for the flash memory circuit includes a 1.5 volt power supply. However, to generate the higher voltage used for writing and erasing operations, a DC voltage boost circuit is used which takes the normal power supply voltage of 1.5 volts and boosts it up to about six (6) volts to perform these higher voltage operations. In general though, DC voltage boost circuit can convert any input voltage to any desired output voltage.

An example of such a DC voltage boost circuit is a capacitor charge pump circuit which includes a plurality of cascaded stages each comprising a switch and a capacitor. A previous stage in the cascade supplies charges to a next stage in boosting an input voltage to a higher output voltage. However, this type of boost circuit is typically inefficient due to the losses incurred in the transfer of charges between stages, and the losses incurred across each capacitor. The efficiency for a DC voltage boost circuit that includes a capacitor charge pump circuit is on the order of about five (5) to eleven (11) percent.

Thus, there is a need for a DC voltage boost circuit that has improved efficiency in the conversion of a relatively low input voltage to a relatively high input voltage. Such a need is provided for in the new DC voltage boost circuits of the invention, as described below. The DC voltage boost circuits of the invention can be used for flash memory, static and dynamic random access memory (RAM) application, or any other application which may or many not be related to memory applications. In general, there is a need for a DC voltage boost circuit that generates an output voltage from an input voltage.

BRIEF DESCRIPTION OF THE DRAWINGS

FIG. 7A illustrates a block/schematic diagram of an exemplary regulation circuit for a booster pump in accordance with the invention;

FIG. 7B illustrates the waveforms involved in the pulse width modulating process of the pulse width modulator of FIG. 7A;

DETAILED DESCRIPTION OF THE INVENTION

Figure 1:
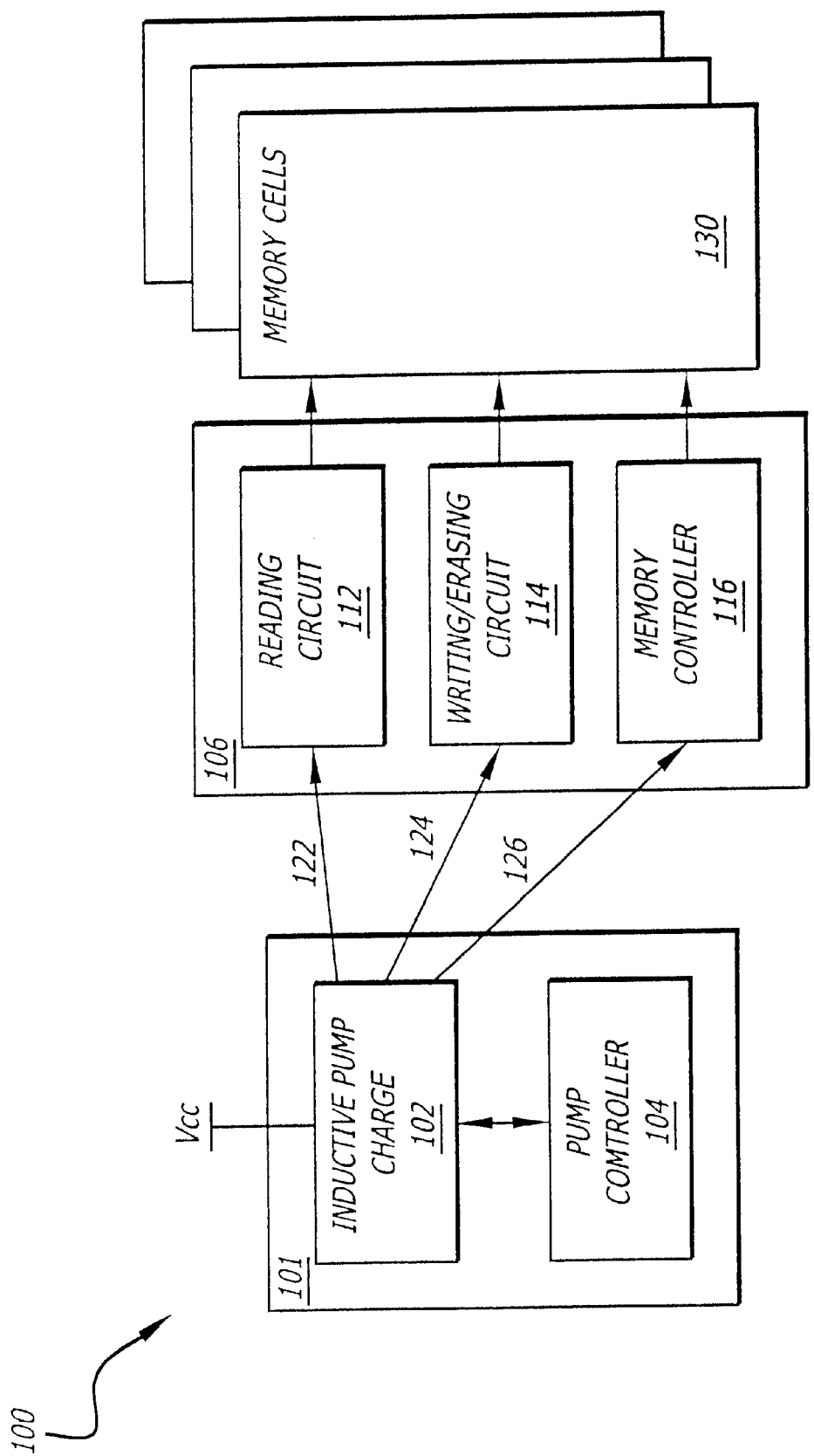
FIG. 1 illustrates a block diagram of an exemplary memory circuit in accordance with the invention.

FIG. 1 illustrates a block diagram of an exemplary memory circuit 100 in accordance with the invention. The memory circuit 100 comprises a DC voltage boost circuit 101, a memory operations circuit 106, and one or more memory arrays 130. The DC voltage boost circuit 101 comprises a charge pump 102 and a pump controller 104. The memory operations circuit 106 comprises a reading decoder 112, a writing/erasing decoder 114, and a memory controller 116.

In operation, the charge pump 102 of the DC voltage boost circuit 101 receives a relatively low power supply voltage (Vcc) and generates voltages for performing reading, writing, erasing and memory controller operations. These voltages are coupled to the reading decoder 112, the writing/erasing decoder 114, and the memory controller 116 of the memory operations circuit 106 by way of lines 122, 124, and 126, respectively. The pump controller 104 regulates the voltages provided to the memory operations circuit so that they are maintained substantially at constant desired voltages. The voltage provided to the writing/erasing decoder 114 is typically higher than the power supply voltage Vcc (e.g. 1 volt), in order to cause the writing and erasing operations. For example, this voltage might be on the order of six (6) volts. Whereas, the voltages for reading and memory control operations are much lower, for example on the order of about 1.5 volts.

The DC voltage boost circuit 101, and all other DC voltage boost circuits described herein, need not be limited to flash memory applications. The DC voltage boost circuits described herein can be used in other applications, including static random access memory (SRAM), dynamic random access memory (DRAM), and other memory applications. In fact, the DC voltage boost circuits described herein need not be limited to memory applications, and can also be used in any other applications that require an output voltage that is different from an input voltage, including wireless, portable computing devices such as personal digital assistants (PDAs), lap top computers, appliances, etc.

Figure 2:
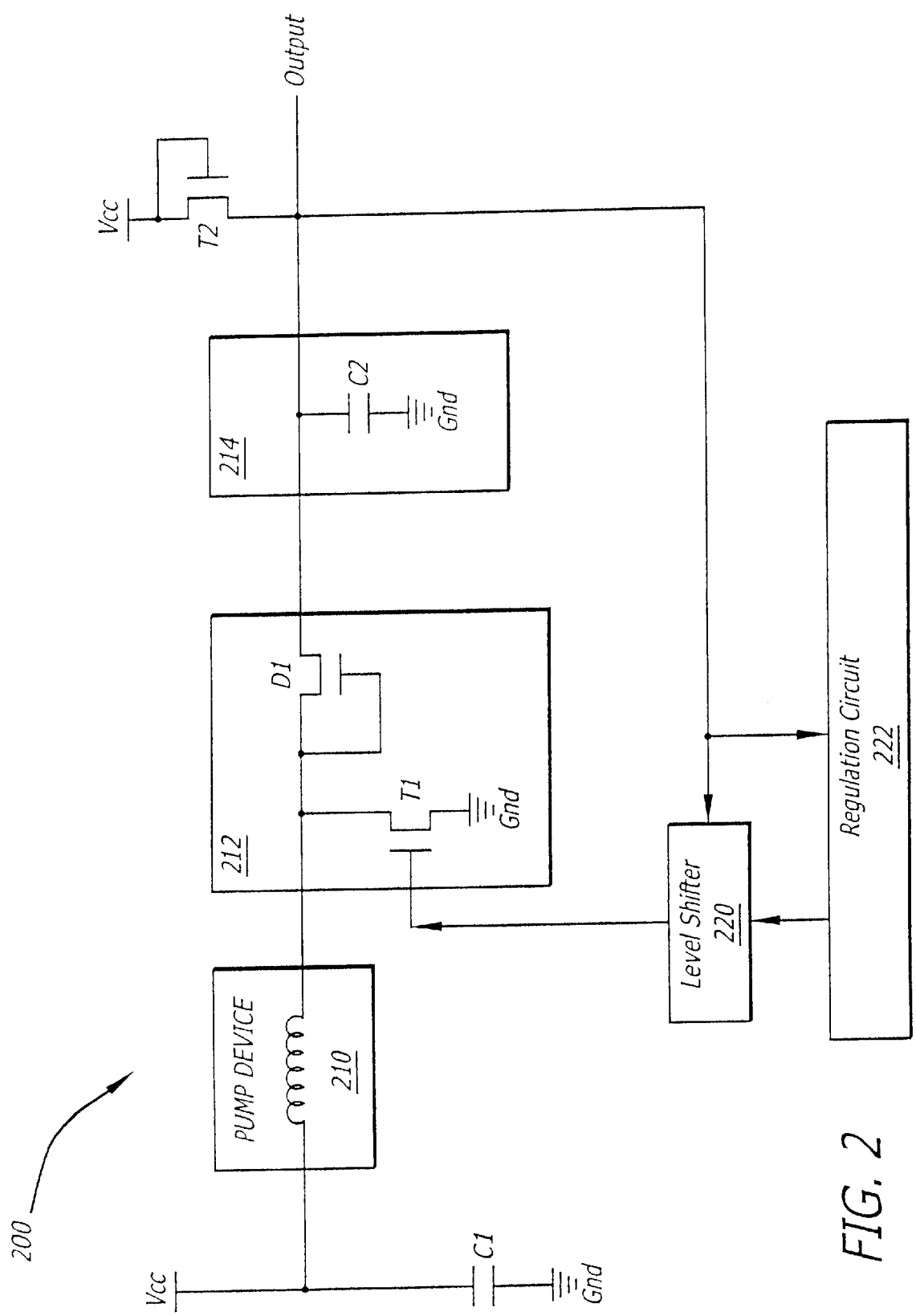
FIG. 2 illustrates a block/schematic diagram of an exemplary DC voltage boost circuit in accordance with the invention.

FIG. 2 illustrates a block/schematic diagram of an exemplary DC voltage boost circuit 200 in accordance with the invention. The DC voltage boost circuit 200 comprises an inductive element 210, a charge pump actuating circuit 212 comprising a switching FET T1 and a diode D1, and an output charging capacitor C2. The DC voltage boost circuit 200 further includes a regulation circuit 222 and a level shifter 220. The DC voltage boost circuit 200 may also include a capacitor C1 situated between Vcc and ground for filtering out noise, spurs and/or other unwanted signals present in the power supply voltage Vcc, and a FET T2 situated between Vcc and the output of the boost circuit 200 to insure that the output is at a sufficient voltage to energize the level shifter upon start-up.

In operation, an oscillating control signal is applied to the gate of the switching transistor T1 which causes the transistor T1 to periodically turn ON and OFF. The turning ON of transistor T1 causes a current to flow from Vcc through the inductive charge pump 210 and down to ground through transistor T1. The inductive charge pump 210 stores the energy formed by the current flowing through the inductive element. When the oscillating control signal causes the transistor T1 to turn OFF, the voltage at the drain of the transistor T1 spikes up, which is transferred to the output capacitor C2 by way of diode D1. The transfer of the voltage (i.e. charges) to the output capacitor C2 increases the output voltage of the DC boost converter.

Thus, each cycle of the control signal causes an additional packet of charges to transfer to the output capacitor C2. The diode D1 prevents those charges from flowing backwards through transistor T1 during the next ON cycle of transistor T1. By continuously cycling the control signal, a build up of charges results on the output capacitor C2 until a steady-state voltage results at the output of the boost circuit 200. The steady-state voltage depends on the characteristics of the control signal, including its frequency and duty cycle.

The output of the DC voltage boost circuit 200 is applied to the regulation circuit 222. The regulation circuit 222 develops the control signal used to drive the switching transistor T1 so that a substantially constant desired voltage is maintained at the output of the boost circuit 200. The regulation circuit 222 can perform this in many ways, including by generating a frequency modulated control signal or a pulse width modulated control signal. In the preferred embodiment, a pulse width modulated control signal is generated in accordance with various regulation circuits described in more detail below. The modulated control signal is sent to the level shifter 220 to increase the modulated control signal voltage so that it can drive the transistor T1 into its ON and OFF states. By increasing the drive to transistor T1 using the level shifter 220, the transistor T1 can be made smaller, which results in a savings of die real estate.

This case addresses the control operation of a regulation circuit that produces a frequency modulated control signal. If the output voltage of the boost circuit 200 falls below a desired level, the regulation circuit 222 senses this decrease. In response to sensing a decrease in the output voltage, the regulation circuit 222 increases the frequency of the modulated signal in order to increase the rate of charges delivered to the output capacitor C2. This action increases the voltage at the output of the boost circuit 200 in order to compensate for the initial drop in the output voltage. If, on the other hand, the output voltage of the boost circuit 200 rises above a desired level, the regulation circuit 222 senses this increase, and responsively decreases the frequency of the modulated signal in order to decrease the rate of charges delivered to the output capacitor C2. This action decreases the voltage at the output of the boost circuit 200 in order to compensate for the initial rise in the output voltage.

This case addresses the control operation of a regulation circuit that produces a pulse width modulated control signal. If the output voltage of the boost circuit 200 falls below a desired level, the regulation circuit 222 senses this decrease. In response to sensing a decrease in the output voltage, the regulation circuit 222 increases the duty cycle of the modulated signal in order to increase the packet size of charges delivered to the output capacitor C2. This action increases the voltage at the output of the boost circuit 200 in order to compensate for the initial drop in the output voltage. If, on the other hand, the output voltage of the boost circuit 200 rises above a desired level, the regulation circuit 222 senses this increase, and responsively decreases the duty cycle of the modulated signal in order to decrease the packet size of charges delivered to the output capacitor C2. This action decreases the voltage at the output of the boost circuit 200 in order to compensate for the initial rise in the output voltage.

It has been determined that the DC voltage boosting circuit 200 operates most efficiently if the duty cycle of the pulse width modulated control signal is approximately 75 percent. If the duty cycle is much lower than 75 percent, less energy is stored in the inductor because the time the current is allowed to flow through the inductor is shorter. If the duty cycle is much greater than 75 percent, there is not enough time to allow the stored energy to transfer to the output capacitor. With the optimum duty cycle for the control signal, the DC voltage boost circuit 200 can achieve an efficiency of approximately 70 percent, which is a substantial increase beyond the 5 to 11 percent efficiency seen in prior art boosting circuits.

Figure 3:
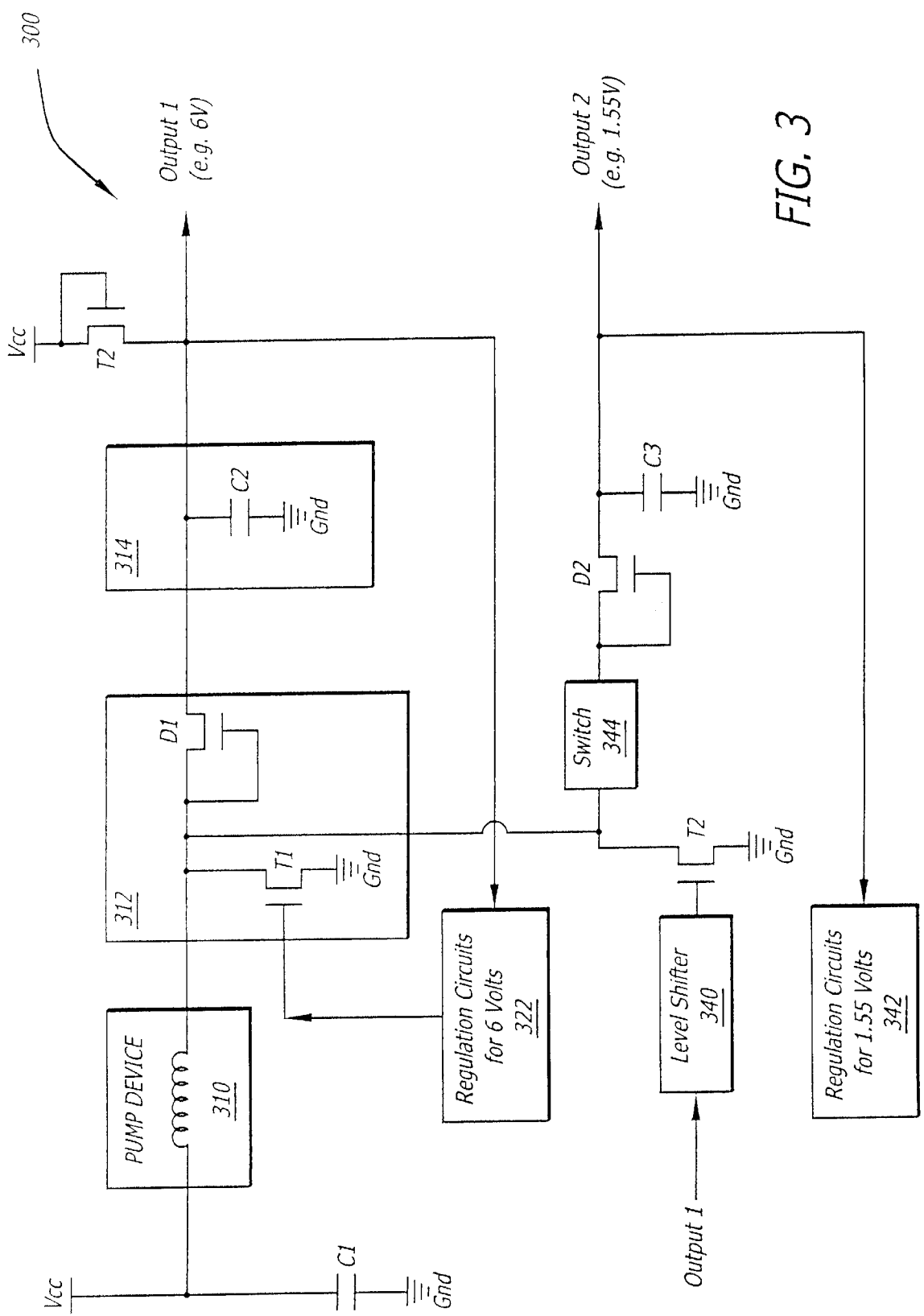
FIG. 3 illustrates a block/schematic diagram of an exemplary DC voltage boost circuit that produces multiple output voltages in accordance with the invention.

FIG. 3 illustrates a block/schematic diagram of an exemplary DC voltage boost circuit 300 that produces multiple output voltages in accordance with the invention. The boost circuit 300 includes a first boosting circuit for producing a first output voltage (i.e. Output 1, e.g. 6 Volts) comprising a switching transistor T1, diode D1, output capacitor C2, transistor T2, and regulation circuit 322. The boost circuit 300 also includes a second boosting circuit for producing a second output voltage (i.e. Output 2, e.g. 1.55 Volts) comprising a switching transistor T2, switch 344, diode D2, output capacitor C3, regulation circuit 342, and level shifter 340. In addition, the boost circuit 300 further includes an inductive charge pump 310 and capacitor C1 that are common to both the first and second boosting circuits.

The first and second boost circuits operate in a similar fashion as described above with reference to DC boost circuit 200 shown in FIG. 2. A switch 344 is provided to the lower voltage boosting circuit to isolate the output 2 when transistor T1 is turned ON. That is, switch 344 is OFF when transistor T1 is turned ON. Also, transistor T2 is turned ON during the OFF time of transistor T1.

Figure 4:
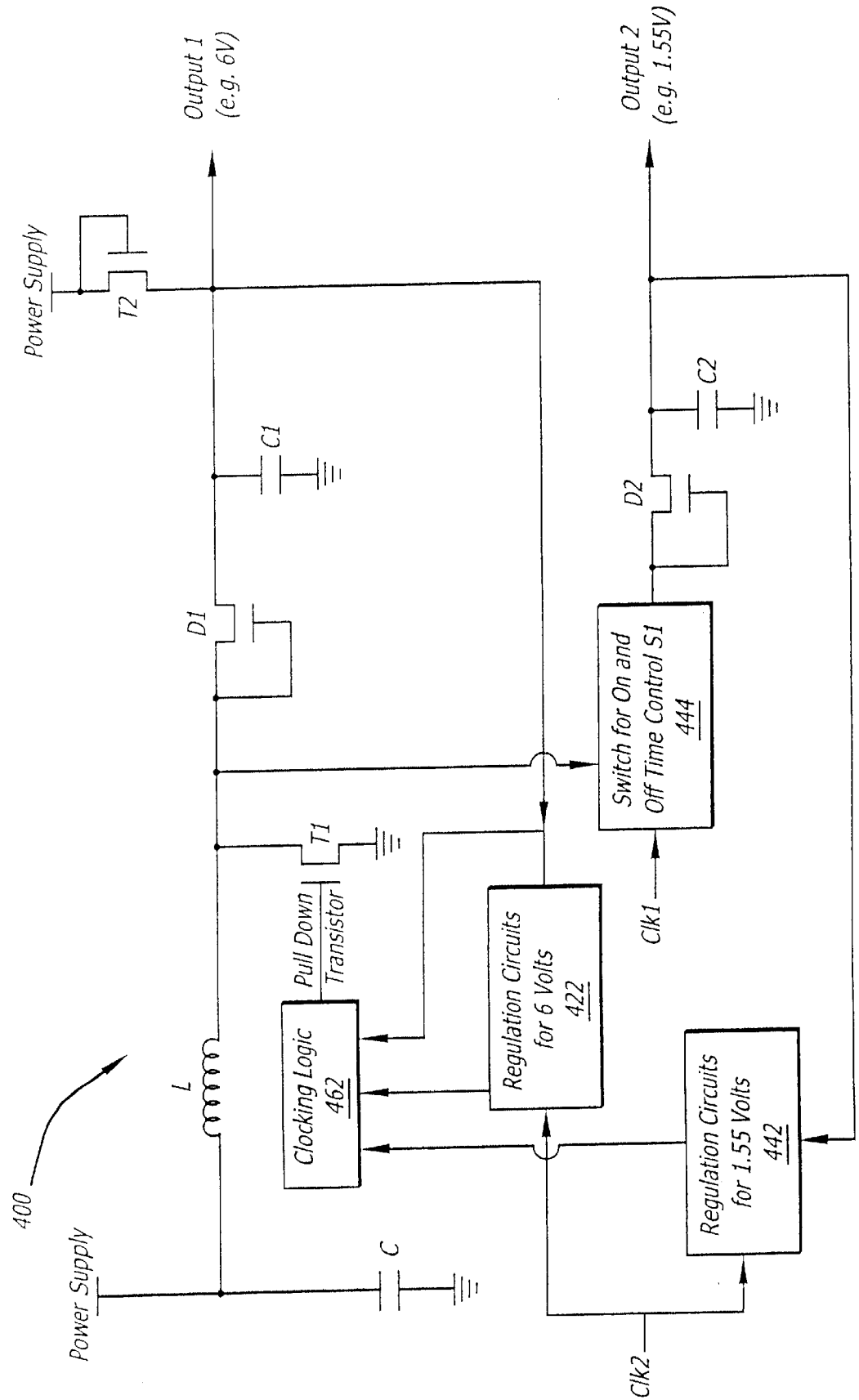
FIG. 4 illustrates a block/schematic diagram of yet another exemplary DC voltage boost circuit that produces multiple output voltages in accordance with the invention.

FIG. 4 illustrates a block/schematic diagram of another exemplary DC voltage boost circuit 400 that produces multiple output voltages in accordance with the invention. The boost circuit 400 includes a first boosting circuit for producing a first output voltage (i.e. Output 1, e.g. 6 Volts) comprising a diode D1, output capacitor C1, transistor T2, and regulation circuit 422. The boost circuit 400 also includes a second boosting circuit for producing a second output voltage (i.e. Output 2, e.g. 1.55 Volts) comprising a switch 444, diode D2, output capacitor C2, and regulation circuit 442. In addition, the boost circuit 400 further includes an input capacitor C, an inductive charge pump L, a switching transistor T1, and a clocking logic 462, common to both the first and second boosting circuits.

The first and second boost circuits operate in a similar fashion as described above with reference to DC boost circuit 200 shown in FIG. 2. The outputs of the 6-Volt regulation circuit 422 and the 1.55 -Volt regulation circuit 442 are provided to the clocking logic 462. The clocking logic 462 generates a time-division multiplexing control signal comprising the two pulse-width modulation control signals from the regulation circuits 422 and 442 at different time slots. The time-division multiplexing control signal drives the common switching transistor T1. The clocking logic 462 may also include a level shifter that uses the voltage at Output 1 to increase the drive on switching transistor T1 so that the switching transistor T1 can be made smaller, as described above.

In operation, during a first phase of the time-division multiplexing control signal, the pulse width modulated control signal generated by the Output 1 regulation circuit 422 drives the switching transistor T1 in order to produce the desired voltage (e.g. 6 Volts) at Output 1. Also in the first phase of the time-division multiplexing control signal, the switch 444 is OFF to isolate the lower voltage Output 2 from the higher voltage generated across transistor T1. During a second phase of the time-division multiplexing control signal, the pulse width modulated control signal generated by the Output 2 regulation circuit 442 drives the switching transistor T1 in order to produce the desired voltage (e.g. 1.55 Volts) at Output 2. Also in the second phase of the time-division multiplexing control signal, the switch 444 is ON to couple the inductive pump and switching transistor T1 to Output 2.

Figure 2A:
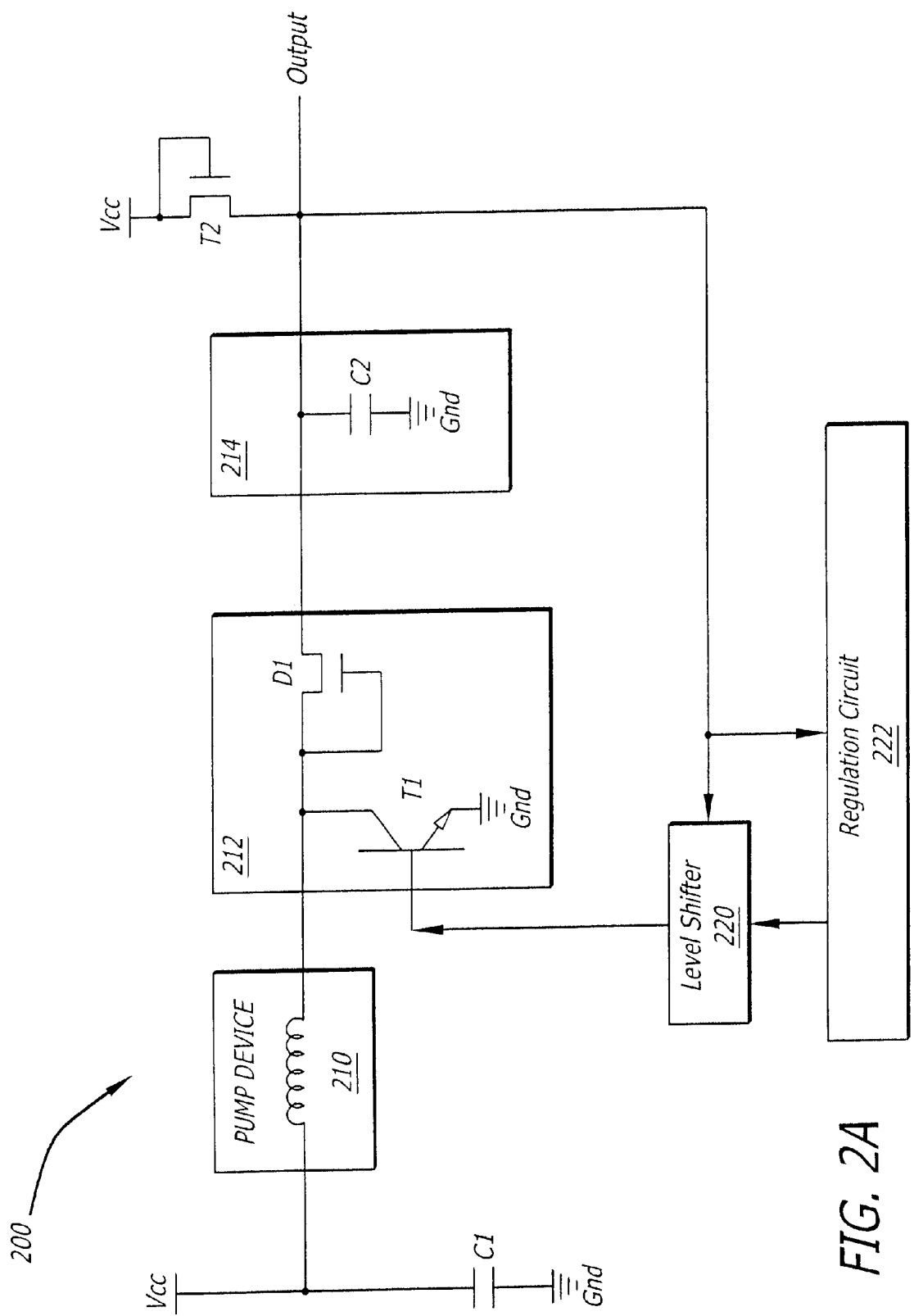
FIG. 2A illustrates a block/schematic diagram of an exemplary DC voltage boost circuit in accordance with the invention.
Figure 3A:
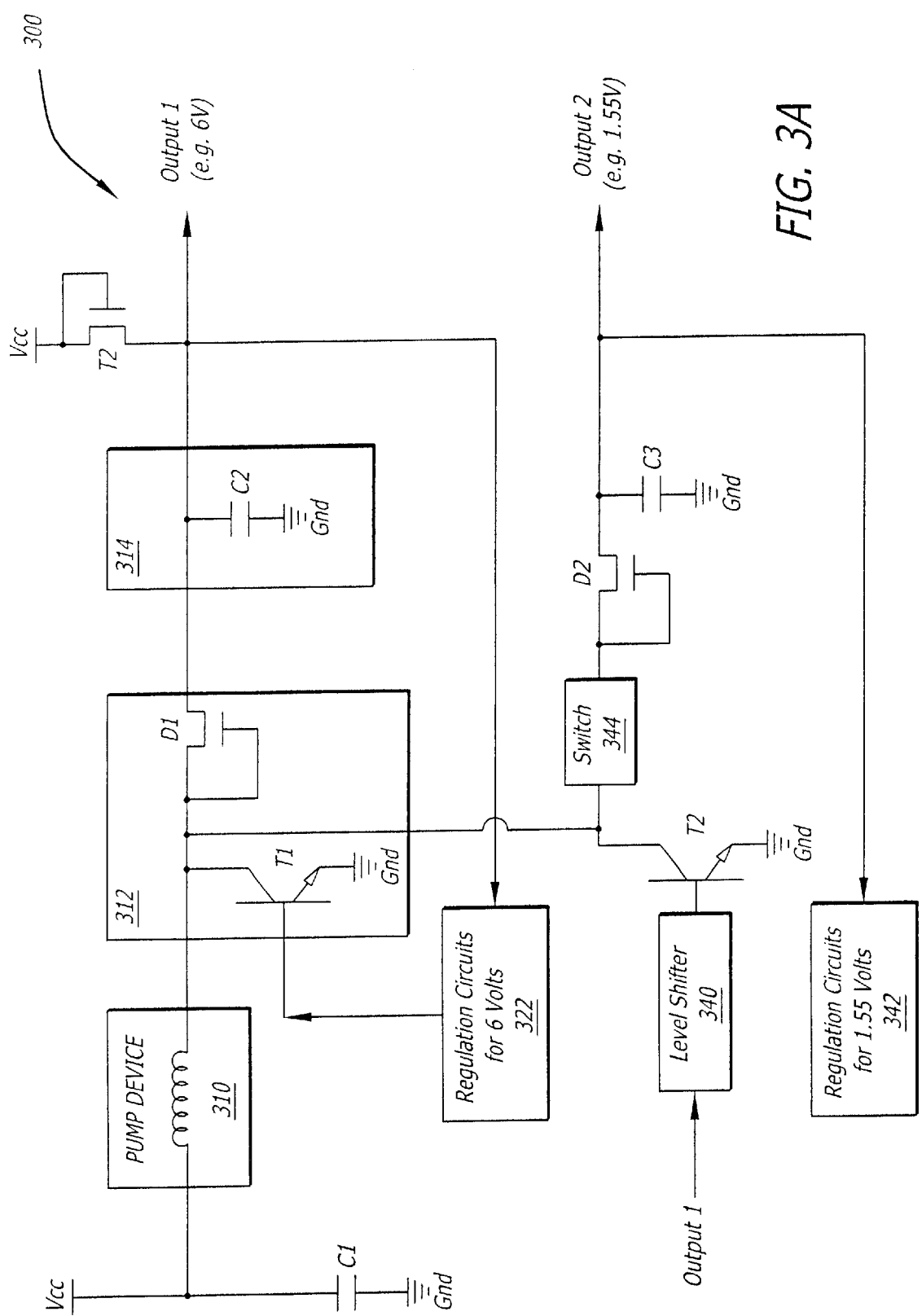
FIG. 3A illustrates a block/schematic diagram of an exemplary DC voltage boost circuit that produces multiple output voltages in accordance with the invention.
Figure 4A:
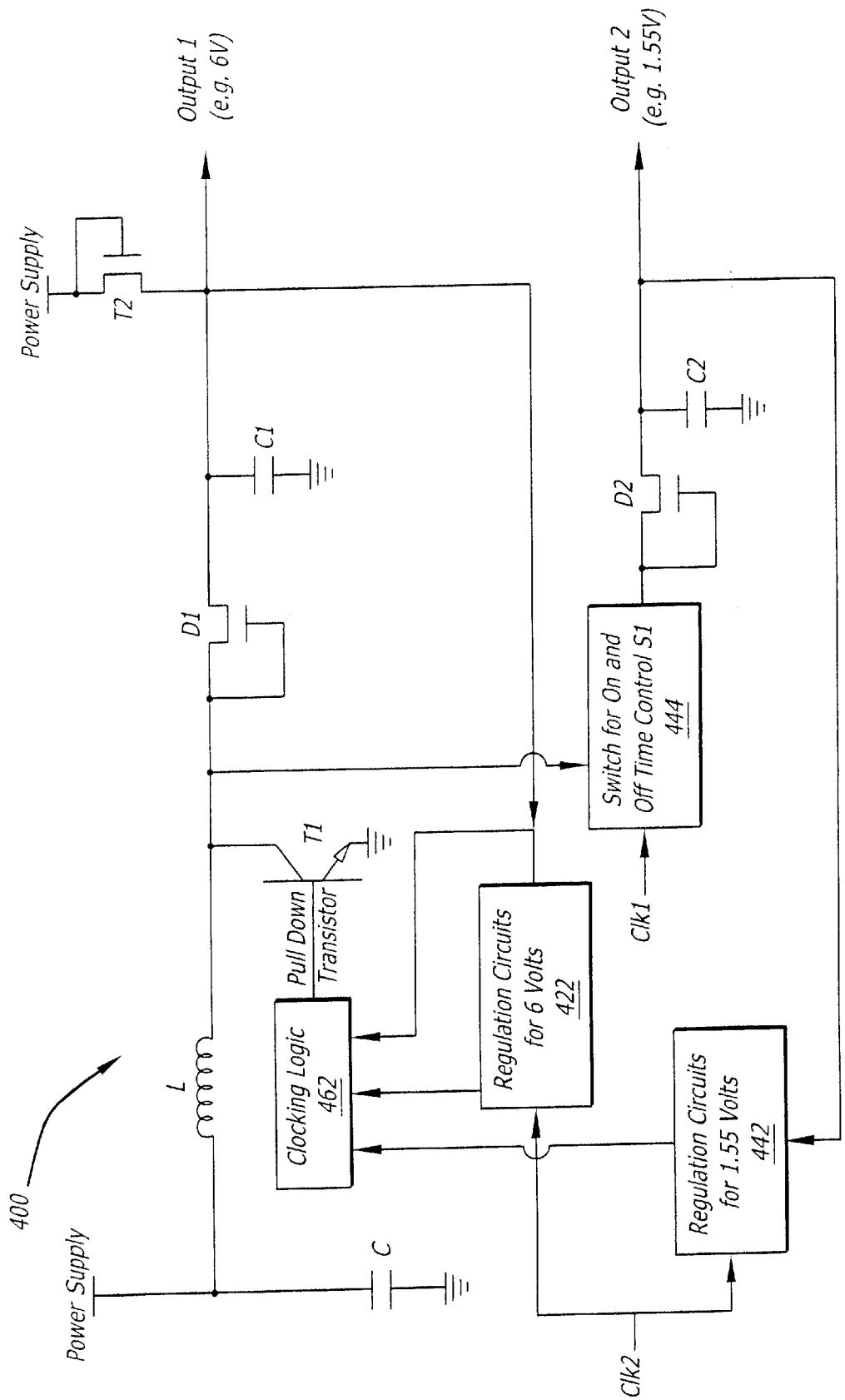
FIG. 4A illustrates a block/schematic diagram of yet another exemplary DC voltage boost circuit that produces multiple output voltages in accordance with the invention.

The regulations circuits 422 and 442 receive a clock Clk2 in order to generate therefrom their respective pulse width modulated control signals. Since the switch 444 is only ON for one period of the pulse width modulated signal and off for the other period, it can be clocked with a clock Clk1 having a frequency half that of Clk2. Likewise, since the clocking logic 462 has to switch between the two pulse width modulated signals, it can also be clocked with clock Clk1. FIGS. 2A, 3A and 4A illustrate boost circuits 200, 300 and 400 with the switching transistor as a bipolar transistor.

Figure 5B:
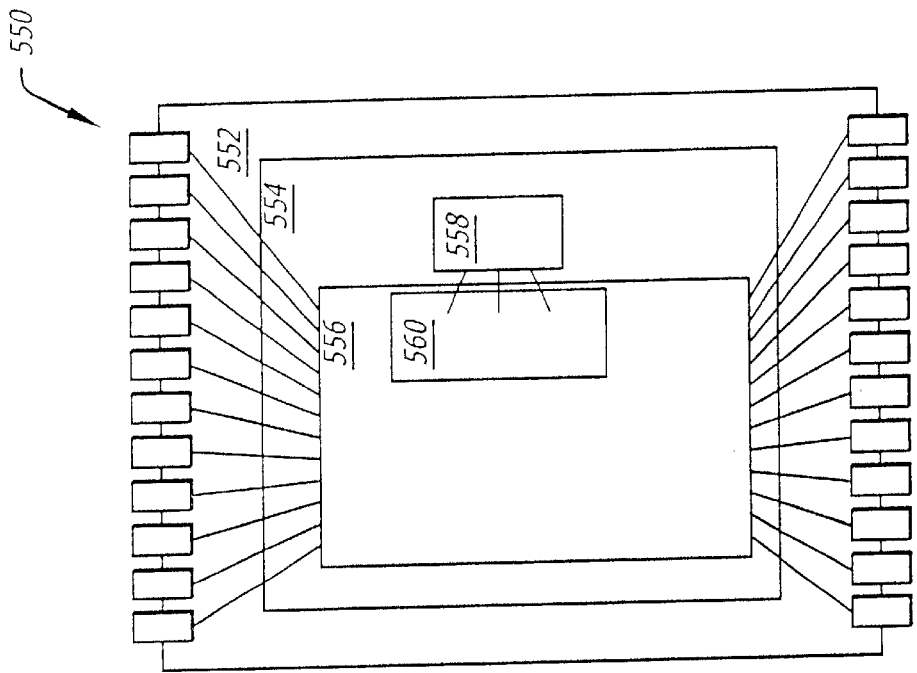
FIG. 5B illustrates a top view of another exemplary integrated circuit incorporating a DC voltage boost circuit in accordance with the invention.
Figure 5A:
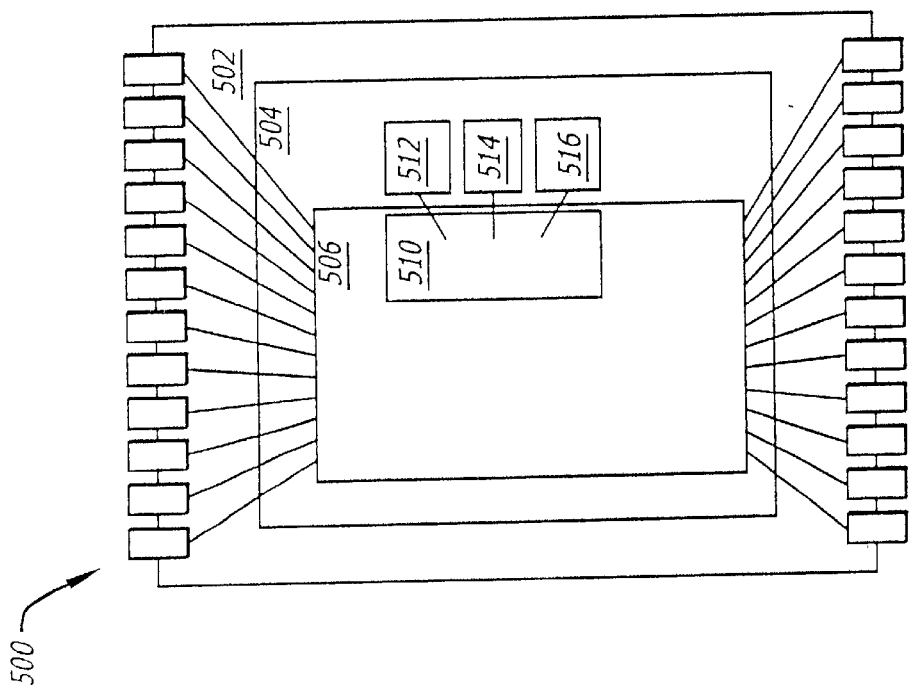
FIG. 5A illustrates a top view of an exemplary integrated circuit incorporating a DC voltage boost circuit in accordance with the invention.

FIG. 5A illustrates a top view of an exemplary integrated circuit 500 incorporating a DC voltage boost circuit in accordance with the invention. The integrated circuit 500 comprises an integrated circuit package 502 including a plurality of leads for connection to external circuitry. The integrated circuit 500 further includes an integrated circuit die 506 situated within the package internal boundary 504 of the integrated circuit package 502. The die 506 in this example incorporates a portion of the DC boost circuit 510 as described above. A plurality of wire bonds or other suitable connection means electrically connects the die circuitry to the package leads. An input capacitor 512, an inductor 514 and/or output capacitor 516 of the DC boost circuit as described above are situated external to the die 506 within the package internal boundary 504. These components can be situated next to a side of the die 506 within the package internal boundary 504 as shown in FIG. 5A, or can be situated on top of the die 506 as well. A plurality of wire bonds or other suitable connection means electrically connect the input capacitor 512, an inductor 514 and/or output capacitor 516 of the DC boost circuit to the remaining portion of the booster circuit 510.

There are several advantages for incorporating the input capacitor 512, the inductor 514 and/or the output capacitor 516 of the DC boost circuit into the integrated circuit package 500, but outside of the die 506. First, substantial savings in the die size results from the incorporation of these three elements 512, 514, and 516 outside of the die 504. Second, substantial increase in the efficiency of the DC voltage boost circuit can be achieved by incorporating the inductor 514 outside of the die 506. A reason for this is that the external inductor 514 can be made with a magnetic substrate having a three-dimensional conductive spiral which can achieve higher inductance and higher current carrying capability. These two characteristics improves the efficiency of the DC booster circuit. Third, by incorporating the input capacitor 512, the inductor 514 and/or the output capacitor 516 within the package 502, the DC boost circuit is self contained in the integrated circuit package 502 without requiring external connections to these components.

FIG. 5B illustrates a top view of another exemplary integrated circuit 550 incorporating a DC voltage boost circuit in accordance with the invention. Integrated circuit 550 is similar to integrated circuit 500 (FIG. 5A), in that it includes an integrated circuit package 552, and an integrated circuit die 556 including a portion of the DC voltage boost circuit 560 situated within an internal boundary 554 of the package 552. The integrated circuit 550 differs from integrated circuit 500 in that at least two of the input capacitor, inductor, and output capacitor can be combined into an integrated substrate 558 instead of having them as three separate components shown in FIG. 5A. This feature can make the assembly of the integrated circuit 550 substantially easier and possibly reduce manufacturing cost and time substantially.

Figure 6:
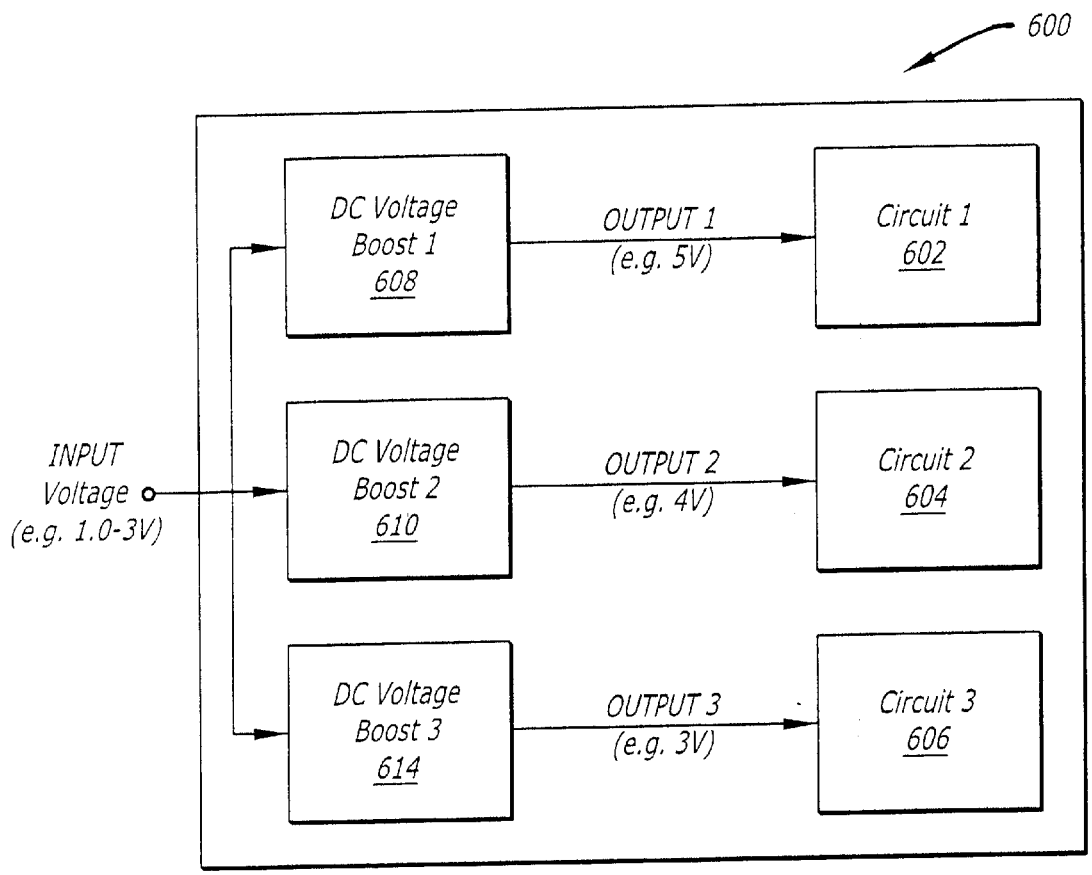
FIG. 6 illustrates a block diagram of an exemplary electronic unit in accordance with the invention.

FIG. 6 illustrates a block diagram of an exemplary electronic unit 600 in accordance with the invention. The electronic unit 600 can be any electronic unit, including an integrated circuit, a circuit board, a module, and/or a sub-module to name a few, that includes a plurality of circuits, such as circuits 1–3 (602, 604, and 606) each of which perform a specific task within the unit. The circuits 1–3 (602, 604, and 606) require particular supply voltages to operate, such as for example 5 Volts for circuit 1 (602), 3 Volts for circuit 2 (604), and 1 Volt for circuit 3 (606). The electronic unit 600 also includes a plurality of DC voltage boost circuits, such as DC voltage boosts 1–3 (608, 610, and 612) for supplying the proper supply voltages outputs 1–3 (e.g. 5 Volts, 3 Volts, and 1 Volts) respectively to the circuits 1–3 (602, 604, and 606). The DC voltage boosts 1–3 (608, 610, and 612) receive a common input voltage for generating their respective outputs 1–3.

An advantage of the electronic unit 600 is that the input voltage to the unit may vary, yet the proper voltages to the various circuits 1–3 of the unit are maintained substantially constant by employing the DC voltage boosts 1–3 (608, 610, and 612) in accordance with the invention. For example, the input voltage may vary from as low as 1 Volt to as high as 3 Volts. The variation may be due to a battery running low on power, or other factors such as line variations, etc. Although the input voltage to the electronic unit 600 may vary, the DC voltage boosts 1–3 (608, 610, and 612) maintains the supply voltages output 1–3 to the respective circuits 1–3 (602, 604, and 606) substantially constant for proper operations of these circuits.

FIG. 7A illustrates a block/schematic diagram of an exemplary regulation circuit 700 for an inductive booster pump 702 in accordance with the invention. The regulation circuit 700 receives the output voltage of the booster pump 702 and provides a pulse width modulated control signal for driving the switching transistor of the boost pump 702 as described above with reference to DC voltage boost circuits 200, 300 and 400. In this exemplary embodiment, the regulation circuit 700 comprises a voltage divider 704 including resistors R1 and R2, a differential amplifier 706, a first comparator 708, a multiplexer 710, a ramp generator 714, a pulse width modulator 716, a second comparator 718, an inverter 720, an AND-gate 722, and a high voltage level shifter 724.

In operation, the output voltage of the booster pump 702 is applied to the voltage divider 704 to produce a lower proportional feedback voltage Vf. The feedback voltage Vf is applied to the differential amplifier 706 to produce a modulating voltage refbias proportional to difference between voltage Vf and a reference voltage ref12. The voltage refbias serves as a modulating signal for the pulse width modulator 716. The reference voltage ref12 sets the output voltage of the booster pump.

The modulating voltage refbias is applied to the first comparator 708 for comparison with another reference voltage ref675. The first comparator 708 produces an input select signal compout1 for the multiplexer 710. If the modulating voltage refbias is above the reference voltage ref675, the select signal compout1 causes the multiplexer 710 to output modulating voltage refbias. If, on the other hand, the modulating voltage refbias is below the reference voltage ref675, the select signal compout1 causes the multiplexer 710 to output the voltage ref675, which serves then as the modulating signal. This insures that modulating signal applied to the pulse width modulator 716 is not below the threshold voltage of the pulse width modulator 716.

The modulating signal refbias from the multiplexer 710 is applied to the pulse width modulator 716 along with a triangular wave signal generated by the ramp generator 714. The ramp generator 714 essentially integrates a square wave clock signal to produce the triangular wave signal. The pulse width modulator 716 is a comparator that compares the modulating signal refbias with the triangular wave signal. The output of the pulse width modulator 716 is a pulse modulated signal Pwm that is modulated by modulating signal refbias, which varies proportionally with the booster output voltage.

FIG. 7B illustrates the waveforms involved in the pulse width modulating process of the regulation circuit 700 in accordance with the invention. The waveforms shown are the clock input to the ramp generator 714, the triangular waveform superimposed with three exemplary voltage levels for the modulating signal refbias, and corresponding output pulse modulated signals corresponding to the three exemplary modulating signal levels.

As it was previously discussed, the square wave clock signal is integrated by the ramp generator 714 to form the triangular waveform as shown in FIG. 7B. The triangular waveform is applied to the positive input of the pulse width modulator comparator 716 and the modulating signal refbias is applied to the negative input of the comparator 716. If the voltage at any given time of the triangular waveform is greater than the modulating signal refbias, then the comparator 716 produces a substantially constant relatively high voltage. If, on the other hand, the voltage at any given time of the triangular waveform is less than the modulating signal refbias, then the comparator 716 produces a substantially constant relatively low voltage, preferably near zero (0) Volts.

Thus, as shown in FIG. 7B, the higher the modulating voltage refbias is, the narrower the pulse width of the pulse width modulated signal Pwm. Conversely, the lower the modulating voltage refbias, the wider the pulse width of the pulse width modulated signal Pwm. Thus, the duty cycle of the modulating signal Pwm is modulated by the modulating signal refbias, which varies with the booster output voltage. Accordingly, when the booster output voltage drops, the duty cycle of the pulse modulated signal increases. This action causes the switching transistor to "turn ON" for a longer time, which causes more energy to be transferred to the output capacitor of the booster 702. This raises the booster output voltage to compensate for its initial drop.

Conversely, when the booster output voltage rises, the duty cycle of the pulse modulated signal decreases. This action causes the pull down transistor to "turn ON" for a shorter time, which causes less energy to be transferred to the output capacitor of the booster 702. This lowers the booster output voltage to compensate for its initial rise.

Referring back to FIG. 7A, the pulse width modulated signal Pwm from the pulse width modulator 716 is applied to an input of the AND-gate 722. The second comparator 718 compares the modulating voltage refbias with the reference voltage ref12, and generates an enabling signal to the AND-gate 722 by way of the inverter 720 if the reference voltage ref12 is greater than the modulating voltage refbias. Or, conversely, generates a disabling signal to the AND-gate 722 if the modulating voltage refbias is greater than the reference voltage ref12. This disables the regulation circuit 700 if the modulating voltage refbias is greater than the reference voltage ref12. This is done to prevent the boost output voltage from exceeding 150 mVolts above the desired boost voltage (e.g. 6 Volts) at all process skew and temperature corners. The pulse width modulated voltage refbias is applied to the high voltage level shifter 724 (when the AND-gate 722 is enabled) to increase it to a sufficient level to drive the switching transistor of the booster pump 702. The level shifter 724 uses the booster output voltage to accomplish this.

Figure 8A:
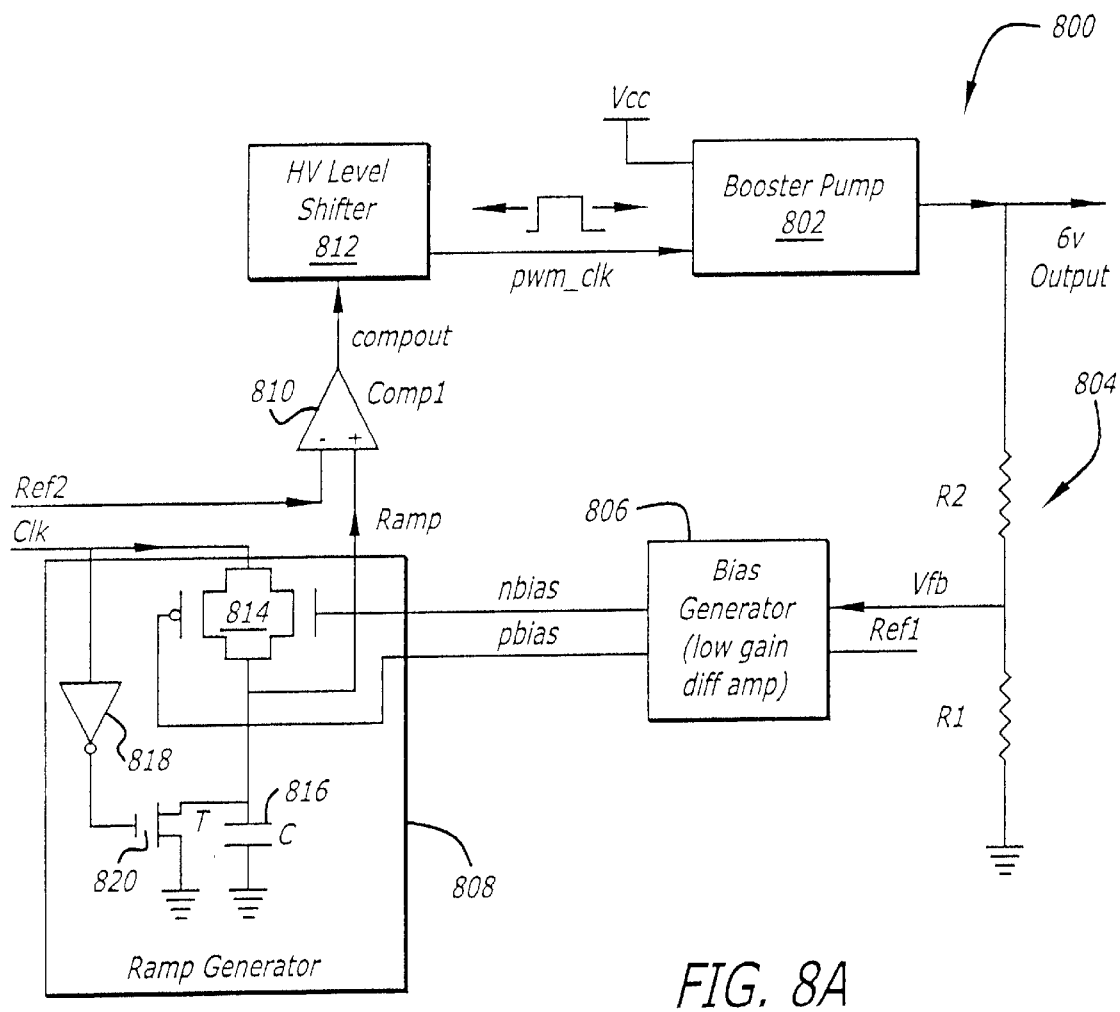
FIG. 8A illustrates a block/schematic diagram of another exemplary regulation circuit for a booster pump in accordance with the invention.

FIG. 8A illustrates a schematic/block diagram of another exemplary regulation circuit 800 useful for regulating the output voltage of an inductive booster pump 802 in accordance with the invention. The regulation circuit 800 receives the output voltage of the booster pump 802 and provides a pulse width modulated control signal for driving the switching transistor of the boost pump 802 as described above with reference to DC voltage boost circuits 200, 300 and 400. In this exemplary embodiment, the regulation circuit 800 comprises a voltage divider 804, a bias generator 806, a ramp generator 808, a pulse width modulator comparator 810, and a high voltage level shifter 812. The ramp generator 808, in turn, comprises a transmission gate 814, a capacitor 816, an inverter 818, and a transistor 820.

In operation, the output voltage of the booster pump 802 is applied to the voltage divider 804 to produce a lower proportional feedback voltage Vfb. The feedback voltage Vfb is applied to the bias generator 806 which is a low gain differential amplifier. The bias generator 806 generates complimentary positive (pbias) and negative (nbias) outputs that vary with the difference between the feedback voltage Vfb and a reference voltage Ref1. The reference voltage Ref1 is used to set the output of the booster pump 802 to a desired voltage level.

The complimentary positive (pbias) and negative (nbias) outputs are applied to the gates of the p-device and n-device of the transmission gate 814, respectively. A clock signal, having a duty cycle of about 75 percent, is applied to the transmission gate 814. The transmission gate 814 in combination with the capacitor 816 operate to integrate the clock signal to form a sawtooth waveform Ramp. The rise time of the sawtooth waveform Ramp varies inversely with the degree to which the transmission gate 814 is turned on, which is a function of the output voltage of the booster pump 802. The inverter 818 in combination with the transistor 820 discharges the capacitor 816 when the clock goes low.

The sawtooth waveform Ramp is applied to the positive input of the pulse width modulating comparator 810. The comparator 810 compares the sawtooth waveform Ramp with a substantially constant reference voltage Ref2. Based on the comparison made by the comparator 810, the comparator 810 generates a pulse modulated control signal Pwm_clk that has a duty cycle that varies inversely with the output voltage of the booster pump 802. The pulse modulated control signal drives the switching transistor of the booster pump 802.

Figure 8B:
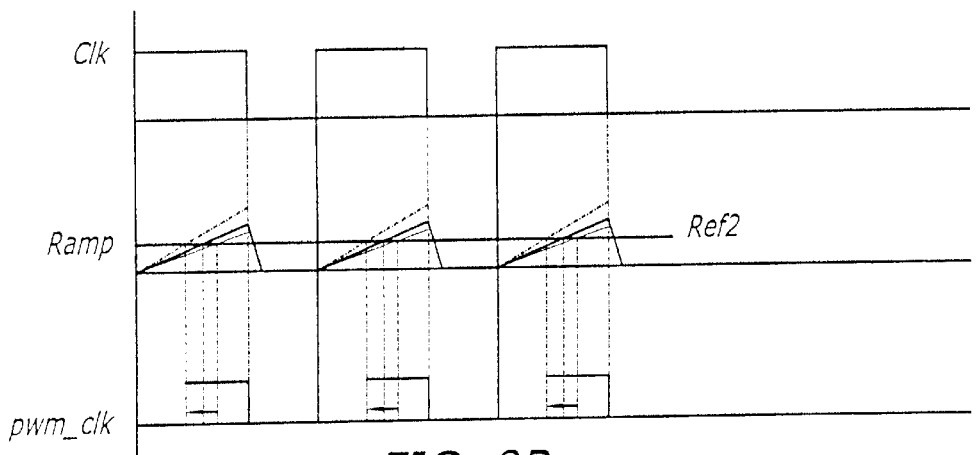
FIG. 8B illustrates the waveforms involved in the pulse width modulating process of the pulse width modulator of FIG. 8A.

FIG. 8B illustrates the waveforms involved in the pulse width modulating process of the regulation circuit 800 in accordance with the invention. The waveforms shown are the clock input to the ramp generator 808, three sawtooth waveforms Ramp corresponding to three different output voltages of the boost pump superimposed with the substantially constant reference voltage Ref2, and the resulting pulse width modulated control signal Pwm_clk. Since the sawtooth waveform Ramp is applied to the positive input and the reference voltage Ref2 is applied to the negative input of the comparator 810, the comparator 810 produces a relatively high output voltage when the sawtooth waveform Ramp is greater than the reference voltage Ref2, and produces a relatively low output voltage when the sawtooth waveform Ramp is less than the reference voltage Ref2.

Thus, as shown in FIG. 8B, the pulse width of the pulse modulated signal is a function of the time the sawtooth waveform Ramp is greater than the reference voltage Ref2. Since the slope of the sawtooth waveform Ramp varies inversely with the output voltage of the boost pump 802, the greater the boost output voltage, the less time the sawtooth waveform Ramp is above the reference voltage Ref2, and consequently, the smaller the pulse width of the resulting pulse modulated signal. Conversely, the lesser the boost output voltage, the more time the sawtooth waveform Ramp is above the reference voltage Ref2, and consequently, the larger the pulse width of the pulse modulated signal. Thus, the duty cycle of the pulse width modulated signal varies inversely with the boost output voltage.

The pulse width modulated signal Pwm_clk is applied to the high voltage level shifter to increase the pulse modulated signal voltage to a sufficient level to drive the switching transistor of the boost pump 802. The pulse width modulated signal Pwm_clk regulates the boost pump 802 so that it produces a substantially constant desired output voltage. The regulation is as follows. When the booster output voltage drops, the duty cycle of the pulse modulated signal Pwm_clk increases. This action causes the switching transistor to "turn ON" for a longer time, which causes more energy to be transferred to the output capacitor of the booster 802. This raises the booster output voltage to compensate for its initial drop. Conversely, when the booster output voltage rises, the duty cycle of the pulse modulated signal Pwm_clk decreases. This action causes the switching transistor to "turn ON" for a shorter time, which causes less energy to be transferred to the output capacitor of the booster 802. This lowers the booster output voltage to compensate for its initial rise.

Figure 9C:
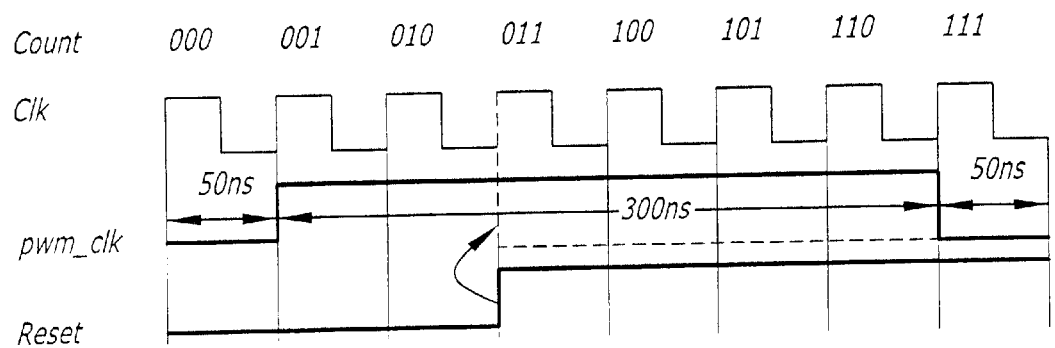
FIG. 9C illustrates the waveforms involved in the pulse width modulating process of the pulse width modulator of FIG. 9A.
Figures 9A, 9B:
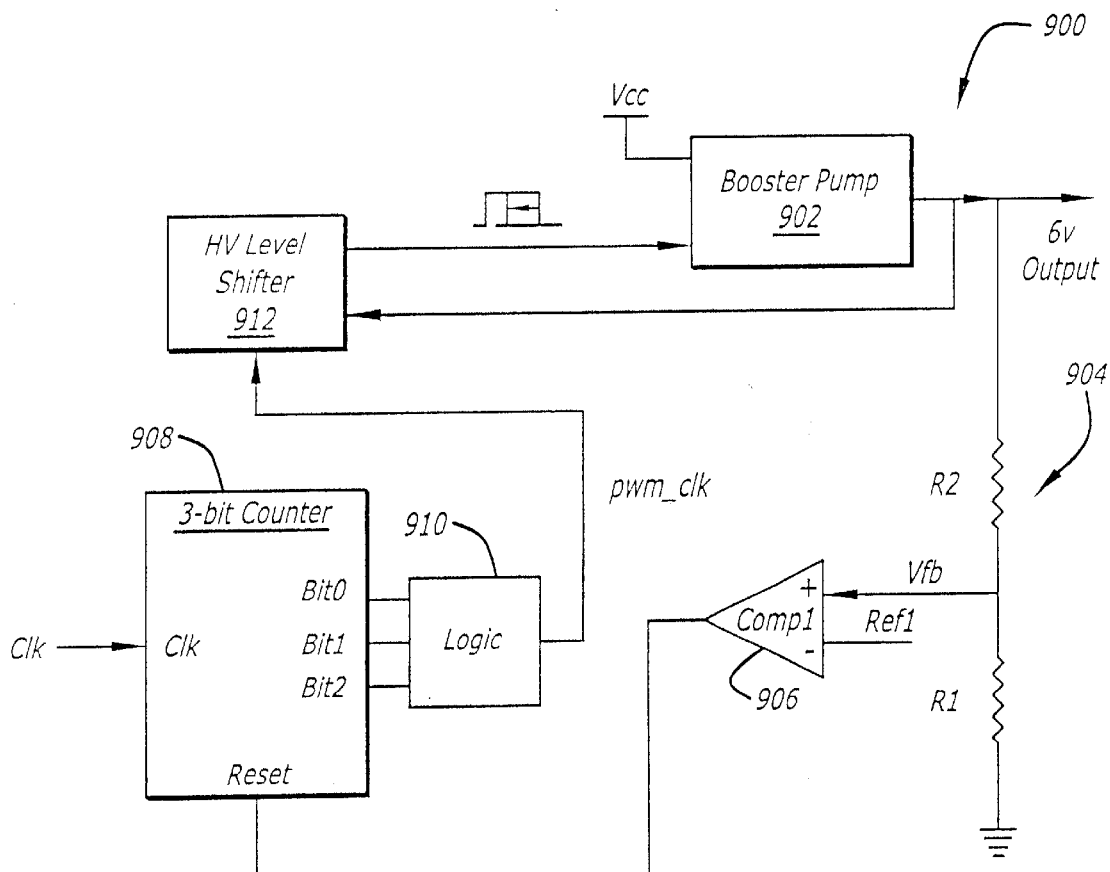
FIG. 9A illustrates a block/schematic diagram of yet another exemplary regulation circuit for a booster pump in accordance with the invention.
FIG. 9B illustrates a binary truth table involved in the pulse width modulating process of the pulse width modulator of FIG. 9A.

FIG. 9A illustrates a schematic/block diagram of yet another exemplary regulation circuit 900 useful for regulating the output voltage of an inductive booster pump 902 in accordance with the invention. The regulation circuit 900 receives the output voltage of the booster pump 902 and provides a pulse width modulated control signal for driving the switching transistor of the boost pump 902 as described above with reference to DC boost circuits 200, 300 and 400. In this exemplary embodiment, the regulation circuit 900 comprises a voltage divider 904, a comparator 906, a 3bit counter 908, a logic circuit 910, and a high voltage level shifter 912.

In operation, the output voltage of the booster pump 902 is applied to the voltage divider 904 to produce a lower proportional feedback voltage Vfb. The feedback voltage Vfb is applied to the positive input of the comparator 906. The comparator 906 compares the feedback voltage Vfb with a reference voltage Ref, and produces a relatively high voltage if the feedback voltage Vfb is greater than the reference voltage Ref, and a relatively low voltage if the feedback voltage Vfb is lower than the reference voltage Ref. The reference voltage Ref is used to set the output of the booster pump 902 to a desired voltage level.

The comparator output is applied to the Reset input of the 3-bit counter 908. A clock signal drives the 3-bit counter 908 to repetitiously count from binary 0 to binary 7 and produce the count at outputs Bit 0,1,2 (Bit 2 being the least significant digit and Bit 0 being the most significant digit of the count). The counter outputs are applied to the logic circuit which produces a pulse width modulated signal pwm_clk in accordance with the truth table shown in FIG. 9B. That is, it produces a high for the count 1–6, and a low for the count 0 and 7.

FIG. 9C illustrates the waveforms involved in the pulse width modulating process of the regulation circuit 900 in accordance with the invention. The count periodically cycles from binary 0 to binary 7. The clock causes the 3-bit counter 908 to increase the count by each every pulse (leading or trailing edge) of the clock. The pulse width modulated signal generated by the logic circuit 910 is high for binary input 1–6 and a low for binary input 0 and 7. The signal applied to the Reset input of the 3-bit counter causes the counter to produce a count of 0 when the Reset signal is high, thereby causing the pulse modulated signal pwm_clk to go low, or remain low if the Reset signal remains high. The pulse modulated signal pwm_clk is applied to the high voltage level shifter 912 to boost its power to sufficient level to drive the switching transistor of the booster pump 902.

The regulation of the booster pump 902 operates as follows. During normal operations where the output voltage is at substantially the desired output voltage, the Reset signal remains low, i.e. the feedback voltage Vfb is lower than the reference voltage Ref. Since it has been determined that the boost pump 902 operates most efficiently at about a duty cycle of 75 percent, the mere cycling of the 3-bit counter produces a pulse modulated signal pwm_clk that has a duty cycle of 75 percent. That is because there are 6 high states and two low states as the counter cycles from binary 0 to binary 7 (See FIG. 9B). If the booster output voltage rises above the desired output voltage, the feedback voltage Vfb rises above the reference voltage Ref, which causes the comparator 906 to generate a high Reset signal. The high Reset signal causes the counter 908 to reset, which in turn, prematurely causes the pulse modulated signal to go low. This reduces the duty cycle of the pulse modulated signal pwm_clk, which causes the output booster voltage to drop to compensate for its initial rise.

The regulation circuits described can be used to regulate the output voltages of the inductive DC boost circuits described herein. In addition, they can also be used to regulate the output voltages of other DC boost circuits, such as the capacitive charge pump boost circuit previously described.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

What is claimed is:

1. A booster circuit, comprising:
   an inductive element;
   a switching device that uses an input voltage to periodically cause current to flow through said inductive element in response to a control signal, wherein said inductive element stores a finite amount of energy each time current is passed therethrough;
   a capacitive element to accumulate a plurality of said finite energy stored in said inductive element in the form of an output voltage; and
   a regulation circuit to generate said control signal to regulate said output voltage, wherein said control signal cycles with a frequency that varies inversely with said output voltage.

2. The booster circuit of claim 1, wherein said inductive element includes an inductor.

3. The booster circuit of claim 1, wherein said switching device comprises a transistor.

4. The booster circuit of claim 3, wherein said transistor comprises a field effect transistor.

5. The booster circuit of claim 3, wherein said transistor comprises a bipolar transistor.

6. The booster circuit of claim 1, wherein said capacitive element includes a capacitor.

7. The booster circuit of claim 1, wherein said control signal cycles with a duty cycle that varies inversely with said output voltage.

8. The booster circuit of claim 1, further including a diode to prevent discharge of said capacitive element through said switching element.

9. A method, comprising:
   periodically generating current through an inductive element using an input voltage, wherein said inductive element stores a finite amount of energy each time current is passed therethrough;
   accumulating a plurality of said finite amount of energy in the form of an output voltage; and
   controlling the periodic generating of the current through said inductive element to achieve a desired voltage level for said output voltage, wherein said controlling includes generating a control signal that is frequency modulated by said output voltage.

10. The method of claim 9, wherein said generating current comprises periodically turning on a switching element to generate said current through said inductive element.

11. The method of claim 10, wherein said switching element comprises a transistor.

12. The method of claim 11, wherein said transistor comprises a field effect transistor.

13. The method of claim 11, wherein said transistor comprises a bipolar transistor.

14. The method of claim 9, wherein said inductive element comprises an inductor.

15. The method of claim 9, wherein said accumulating is performed by a capacitive element.

16. The method of claim 9, wherein said control signal is pulse width modulated by said output voltage.

17. A booster circuit, comprising:
   an inductive element;
   a first switching device that uses an input voltage to periodically cause current to flow through said inductive element in response to a first control signal, wherein said inductive element stores a finite amount of energy each time current is passed therethrough;

a first capacitive element to accumulate a plurality of said finite energy stored in said inductive element in the form of a first output voltage;

a first regulation circuit for generating said first control signal that regulates said first output voltage;

a second switching device that uses said input voltage to periodically cause current to flow through said inductive element in response to a second control signal, wherein said inductive element stores a finite amount of energy each time current is passed therethrough;

a second capacitive element to accumulate a plurality of said finite energy stored in said inductive element in the form of a second output voltage; and a second regulation circuit to generate said second control signal that regulates said second output voltage.

18. The booster circuit of claim 17, wherein said inductive element includes an inductor.

19. The booster circuit of claim 17, wherein said first and second switching devices each comprises a transistor.

20. The booster circuit of claim 19, wherein said transistor comprises a field effect transistor.

21. The booster circuit of claim 19, wherein said transistor comprises a bipolar transistor.

22. The booster circuit of claim 17, wherein said first and second capacitive elements each includes a capacitor.

23. The booster circuit of claim 17, wherein said first and/or second control signal cycle with a frequency that varies inversely with respective first and/or second output voltages.

24. The booster circuit of claim 17, wherein said first and/or second control signal cycle with a duty cycle that varies inversely with respective first and/or second output voltages.

25. The booster circuit of claim 17, further including first and/or second diodes to prevent discharge of respective first and/or second capacitive elements through said first and/or second switching element, respectively.

26. The booster circuit of claim 17, further including:

an integrated circuit die incorporating said first and second switching devices and said first and second regulation circuits; and an integrated circuit package for encasing said integrated circuit die, said inductive element and said first and second capacitive elements, wherein said inductive and/or first and second capacitive elements are situated external to said integrated circuit die.

27. The booster circuit of claim 26, wherein said inductive and/or first and second capacitive elements are situated adjacent said integrated circuit die within an internal boundary of said integrated circuit package.

28. The booster circuit of claim 26, wherein said inductive and/or first and second capacitive elements are disposed o n said integrated circuit die.

29. A booster circuit, comprising:

an inductive element;

a switching device that uses an input voltage to periodically cause current to flow through said inductive element in response to first and second control signals, wherein said inductive element stores a finite amount of energy each time current is passed therethrough;

a firs t capacitive element to accumulate a plurality of said finite energy stored in said inductive element caused by said switching device response to said first control signal, wherein said accumulated energy forms a first output voltage;

a first regulation circuit for generating said first control signal that regulates said first output voltage;

a second capacitive element to accumulate a plurality of said finite energy stored in said inductive element caused by said switching device response to said second control signal, wherein said accumulated energy forms a second output voltage; and a second regulation circuit to generate said second control signal that regulates said second output voltage.

30. The booster circuit of claim 29, further including a multiplexer to produce a time-division multiplexing control signal comprising said first and second control signals at different time slots, said switching device being responsive to said time-division multiplexing signal to cause said periodic current flow through said inductive element.

31. The booster circuit of claim 29, wherein said inductive element includes an inductor.

32. The booster circuit of claim 29, wherein said switching device comprises a transistor.

33. The booster circuit of claim 32, wherein said transistor comprises a field effect transistor.

34. The booster circuit of claim 32, wherein said transistor comprises a bipolar transistor.

35. The booster circuit of claim 29, wherein said first and second capacitive elements each includes a capacitor.

36. The booster circuit of claim 29, wherein said first and/or second control signal cycle with a frequency that varies inversely with respective first and/or second output voltages.

37. The booster circuit of claim 29, wherein said first and/or second control signal cycle with a duty cycle that varies inversely with respective first and/or second output voltages.

38. The booster circuit of claim 29, further including first and/or second diodes to prevent discharge of respective first and/or second capacitive elements through said second switching element.

39. The booster circuit of claim 29, further including:

an integrated circuit die incorporating said switching device and said first and second regulation circuits; and an integrated circuit package for encasing said integrated circuit die, said inductive element, and said first and second capacitive elements, wherein said inductive and/or first and second capacitive elements are situated external to said integrated circuit die.

40. The booster circuit of claim 39, wherein said inductive and/or first and second capacitive elements are situated adjacent said integrated circuit die within an internal boundary of said integrated circuit package.

41. The booster circuit of claim 39, wherein said inductive and/or first and second capacitive elements are disposed on said integrated circuit die.

42. An integrated circuit comprising:

an integrated circuit package;

an inductive element situated within said integrated circuit package;

a capacitive element situated within said integrated circuit package; and an integrated circuit die situated within said integrated circuit package, wherein said inductive element and/or capacitive element are situated external to said integrated circuit die, said integrated circuit die comprising:

a switching device that uses an input voltage to periodically cause current to flow through said inductive element in response to a control signal, wherein said inductive element stores a finite amount of energy each time current is passed therethrough, and wherein said capacitive element accumulates a plurality of said finite energy stored in said inductive element in the form an output voltage; and
a regulation circuit to generate said control signal to regulate said output voltage.

43. The integrated circuit of claim 42, wherein said inductive and/or capacitive element are disposed on top of said integrated circuit die.

44. The integrated circuit of claim 42, wherein said inductive and/or capacitive element are disposed on an internal surface of said integrated circuit package.

45. The booster circuit of claim 42, wherein said inductive element includes an inductor.

46. The booster circuit of claim 42, wherein said switching device comprises a transistor.

47. The booster circuit of claim 44, wherein said transistor comprises a field effect transistor.

48. The booster circuit of claim 44, wherein said transistor comprises a bipolar transistor.

49. The booster circuit of claim 42, wherein said capacitive element includes a capacitor.

50. The booster circuit of claim 42, wherein said control signal cycles with a frequency that varies inversely with said output voltage.

51. The booster circuit of claim 42, wherein said control signal cycles with a duty cycle that varies inversely with said output voltage.

52. The booster circuit of claim 42, further including a diode to prevent discharge of said capacitive element through said switching element.

* * * * *